United States Patent [19]
Veytsman et al.

[11] Patent Number: 5,821,774
[45] Date of Patent: Oct. 13, 1998

[54] STRUCTURE AND METHOD FOR ARITHMETIC FUNCTION IMPLEMENTATION IN AN EPLD HAVING HIGH SPEED PRODUCT TERM ALLOCATION STRUCTURE

[75] Inventors: Isaak Veytsman, Santa Clara; Jeffrey H. Seltzer, Los Gatos, both of Calif.

[73] Assignee: Xilinx, Inc., San Jose, Calif.

[21] Appl. No.: 726,115

[22] Filed: Oct. 4, 1996

Related U.S. Application Data

[63] Continuation-in-part of Ser. No. 452,448, May 26, 1995, Pat. No. 5,563,529.

[51] Int. Cl.⁶ .............................................. H03K 19/177
[52] U.S. Cl. ................................................. 326/39
[58] Field of Search ........................................ 326/39

[56] References Cited

U.S. PATENT DOCUMENTS

| | | | |
|---|---|---|---|
| 5,121,006 | 6/1992 | Pedersen | 326/39 |
| 5,350,954 | 9/1994 | Patel | 326/39 |
| 5,357,153 | 10/1994 | Chiang et al. | 326/39 |
| 5,359,242 | 10/1994 | Veenstra | 326/39 |
| 5,450,608 | 9/1995 | Steele | 326/39 |
| 5,565,792 | 10/1996 | Chiang et al. | 326/39 |

*Primary Examiner*—David C. Nelms
*Assistant Examiner*—Richard Roseen
*Attorney, Agent, or Firm*—Adam H. Tachner - Crosby, Heafey, Roach & May; Jeanette S. Harms

[57] ABSTRACT

An EPLD having improved routing and arithmetic function implementation characteristics. Cascade and carry logic in macrocells allows for rapid implementation of arithmetic functions without unnecessarily tying up device processing and interconnect resources or unnecessarily delaying processing.

32 Claims, 13 Drawing Sheets

STRUCTURE AND METHOD FOR ARITHMETIC FUNCTION IMPLEMENTATION IN AN EPLD HAVING HIGH SPEED PRODUCT TERM ALLOCATION STRUCTURE

RELATION TO PRIOR APPLICATIONS

This application is a continuation-in-part of Ser. No. 08/452,443, filed May 26, 1995, now U.S. Pat. No. 5,563,529 entitled HIGH SPEED PRODUCT TERM ALLOCATION STRUCTURE SUPPORTING LOGIC ITERATION AFTER COMMITTING DEVICE PIN LOCATIONS to Seltzer, et al., issued Oct. 8, 1996, which is incorporated herein by reference.

BACKGROUND OF THE INVENTION

1. Field of the Invention

This invention relates generally to custom programmable integrated circuit logic devices, and more particularly to an improved Programmable Array Logic-based erasable-programmable logic device (EPLD) including an improved arithmetic function architecture.

2. Description of the Background Art

In response to the increasing need for flexibility and speed in integrated circuit (IC) design, a class of IC's known as erasable programmable logic devices (EPLDs) was developed. EPLDs enable the designer to custom program arbitrary logical functions in an IC chip, according relative ease and flexibility in testing prototypes and making design changes.

FIG. 1 illustrates one EPLD architecture which includes an array of function blocks 1, 2, 3, 4 interconnected via a universal interconnect matrix (UIM) 5. For simplicity, only one function block is shown in detail. The input lines 6 into function block 1 are programmably combined into a number of AND gates 7 in an AND array 8. The output lines 9 from AND array 8 are called product terms (or bit lines). Product terms 9 of AND gates 7 are provided to one of a plurality of macrocells (MC) 10 in each function block.

The architecture of a typical macrocell 10 is shown in FIG. 2. Macrocell 10 configures the outputs of AND array 8 of FIG. 1 and may perform additional logic on the output signals of AND array 8. Macrocell 10 contains an OR gate 11 into which product terms are gated, and a register (flip flop) 12 for storing the output signal of OR gate 11. The signals on output line 13 of OR gate 11 and output lines 13a and 13b of register 12 are programmably routed by setting the multiplexers (MUXs) 14, 15 and 16 with configuration bits on their control terminals, each specifying the output state of the respective MUX.

Macrocell 10 advantageously provides a relatively large number of product terms 11.1 per macrocell. However, a fixed product term count is not flexible enough to handle the product term count variability that arises during use of the macrocell. Specifically, user product term requirements for a logic function typically vary widely, anywhere from one to sixteen product terms or more, depending on the complexity of the logic function. In fact, single product term functions are quite common. For logic functions requiring less than eight product terms in macrocell 10, for example, the unused product terms are wasted. For functions requiring more than eight product terms, the function must be split up into two or more subfunctions, each of which can be implemented with the available eight product terms of a macrocell. The results of the subfunction operations must make additional passes through the UIM to be recombined in other macrocells, thus incurring a significant time delay in the execution of complex logic functions.

To address the need for a flexible macrocell architecture, more recent EPLDs feature macrocells with the ability to direct their OR gate output signals directly into adjacent macrocell OR gates, without passing through the interconnect matrix, a feature known as cascading. Cascading enables product terms associated with more than one macrocell to be implemented rapidly, without incurring the delay normally associated with routing signals through the interconnect matrix.

Cascading can also increase the speed of arithmetic functions. Some macrocells include an arithmetic logic unit (ALU) which provides a convenient cascading tool for quickly calculating multi-bit arithmetic functions over a plurality of macrocells. One available EPLD with an ALU in each macrocell is the Xilinx XC7000™ EPLD. In the XC7000 EPLD, the ALU of FIG. 3 is incorporated into a macrocell similar to the one shown in FIG. 2. A prior art programmable adder circuit including two macrocells which use the ALU of FIG. 3 is shown in FIG. 4. Carry blocks 10 include the dedicated carry function of the ALU of FIG. 3. Adder blocks 15 comprise programmable 2-bit function generators for completing the adder circuit, as shown.

The function generator in the ALU of FIG. 3 is identical to function block 15 shown in FIG. 4 and is commonly configured as an XOR block to create the adder circuit shown. Because adder logic is modular, each XC7000 macrocell can contain an identical programmable adder circuit. The equations for the adder module's arithmetic sum S of two bits a and b with a carry-in bit Cin and carry-out bit Cout are:

$$S = a \oplus b \oplus Cin \quad \text{(Eqn. 1)}$$

and for the carry out bit, $$Cout = a*b + a*Cin + b*Cin \quad (2)$$

where "$\oplus$" represents a logical Exclusive OR (XOR) function, "*" represents a logical AND function, and "+" represents a logical OR function. By passing the carry information across adjacent macrocells including the arithmetic module through a cascading scheme, a fast and efficient adder chain may be implemented for a large number of bits.

FIG. 5 provides a partial schematic illustration of an EPLD developed more recently than the XC7000 series, the XILINX XC9000 series. The XC9000 series of devices abandoned the specialized arithmetic carry logic and ALU of the XC7000 series in an effort to maximize the overall speed of combinational logic applications. As a result, any arithmetic function above four bits in size implemented on a XC9000 series device consumes at least twice the macrocell resources of a XC7000 series device performing the same function and incurs even greater propagation delay because of the need to route the function through the UIM or similar interconnect mechanism between macrocells.

However, the XC9000 series architecture provides a number of advantages over other available EPLDs. As can be seen from FIG. 5, the XC9000 series architecture contains a product-term cascading circuit, modified from the XC7000 series, that establishes special logic paths between adjacent macrocells (defined as either previous or subsequent) for implementing large combinational logic functions. The XC9000 series architecture utilizes XOR gate logic in each macrocell, useful for implementing counters and other logic functions. The XC9000 series devices also provide product term allocation structure which allows routing of product terms in a bidirectional manner between macrocells, routing of product terms through a plurality of macrocells, routing a selectable and variable number of product terms without a loss of capacity in the macrocell from which the product term is routed, and importing product terms to perform a large function within a local macrocell, while simultaneously exporting product terms from the local macrocell to another macrocell.

There is therefore a need in the art for an EPLD which combines the routing capabilities and other advantages of the existing XC9000 series macrocell architecture with a cascadable arithmetic function circuit structure to increase macrocell utility and speed without monopolizing device resources.

SUMMARY OF THE INVENTION

To address the above-described need in the art, an inventive EPLD macrocell is disclosed which provides increased function density and arithmetic function performance with minimal impact on circuit complexity or the speed of the primary logic paths established through recent EPLD innovations. The macrocell circuit of the present invention utilizes combinational logic paths running between macrocells for the additional purpose of arithmetic ripple-carry and XOR' gates for the additional purpose of forming the sum outputs of arithmetic logic.

BRIEF DESCRIPTION OF THE DRAWINGS

The aforementioned advantages of the present invention as well as additional advantages thereof will be more clearly understood hereinafter as a result of a detailed description of a preferred embodiment of the invention when taken in conjunction with the following drawings in which.

DETAILED DESCRIPTION OF THE INVENTION

Figure 1:
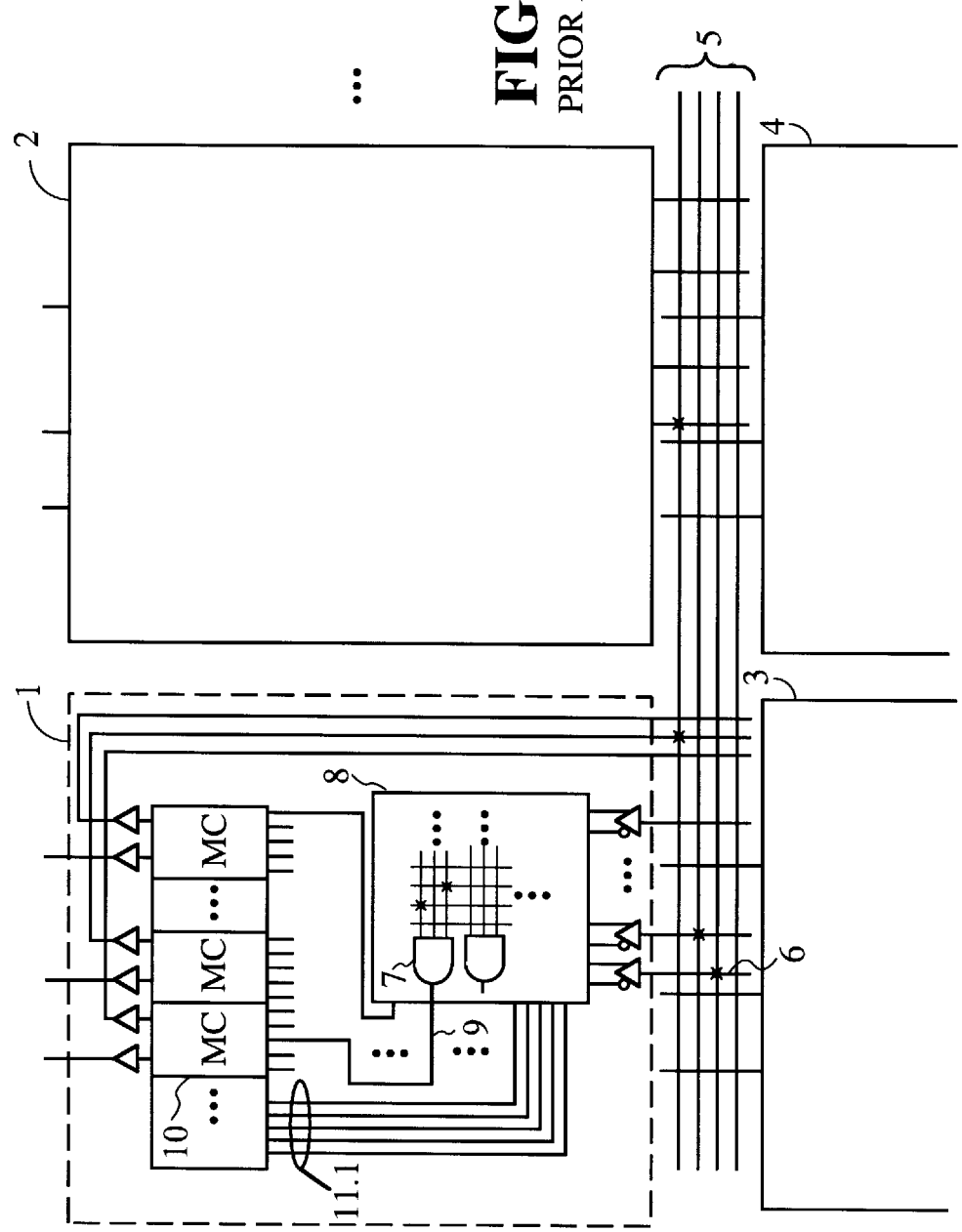
FIG. 1 is a block diagram of a prior art PLD architecture.
Figure 2:
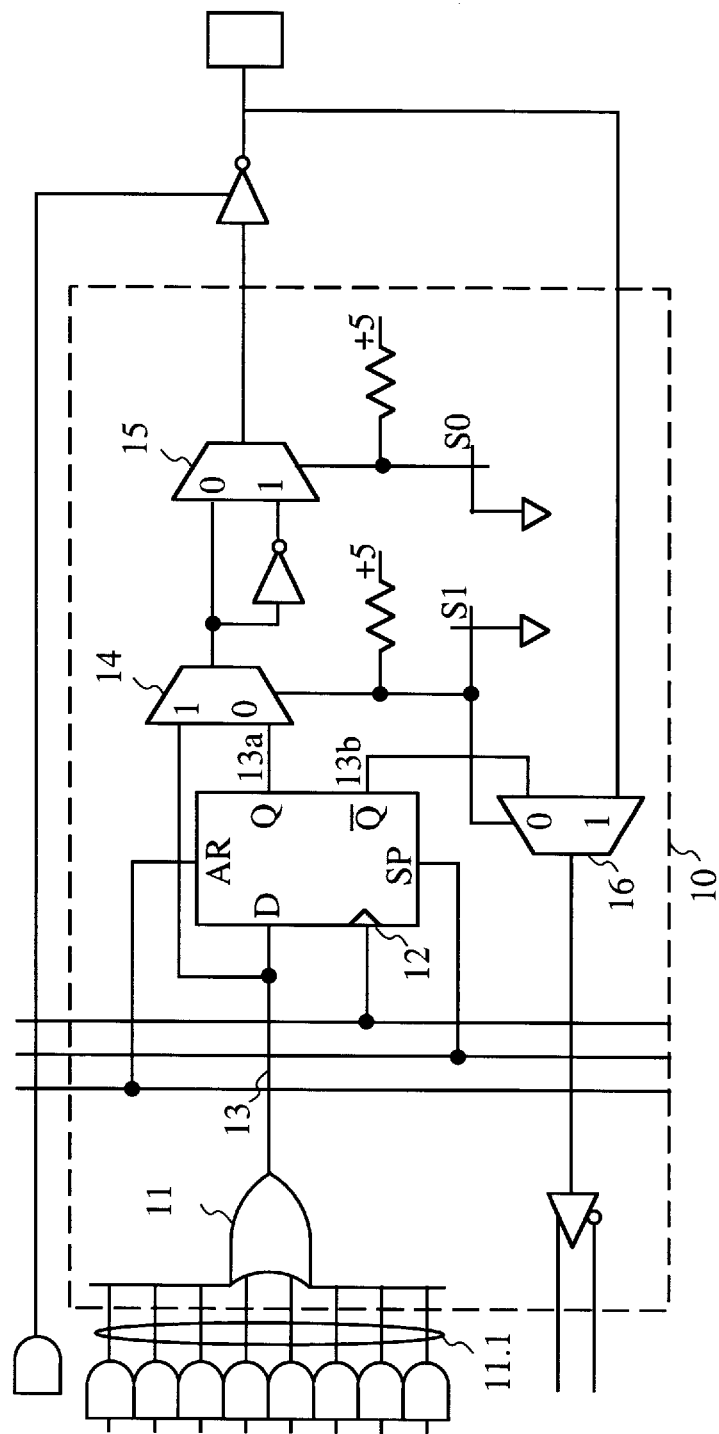
FIG. 2 is a schematic diagram of a prior art macrocell circuit.
Figure 3:
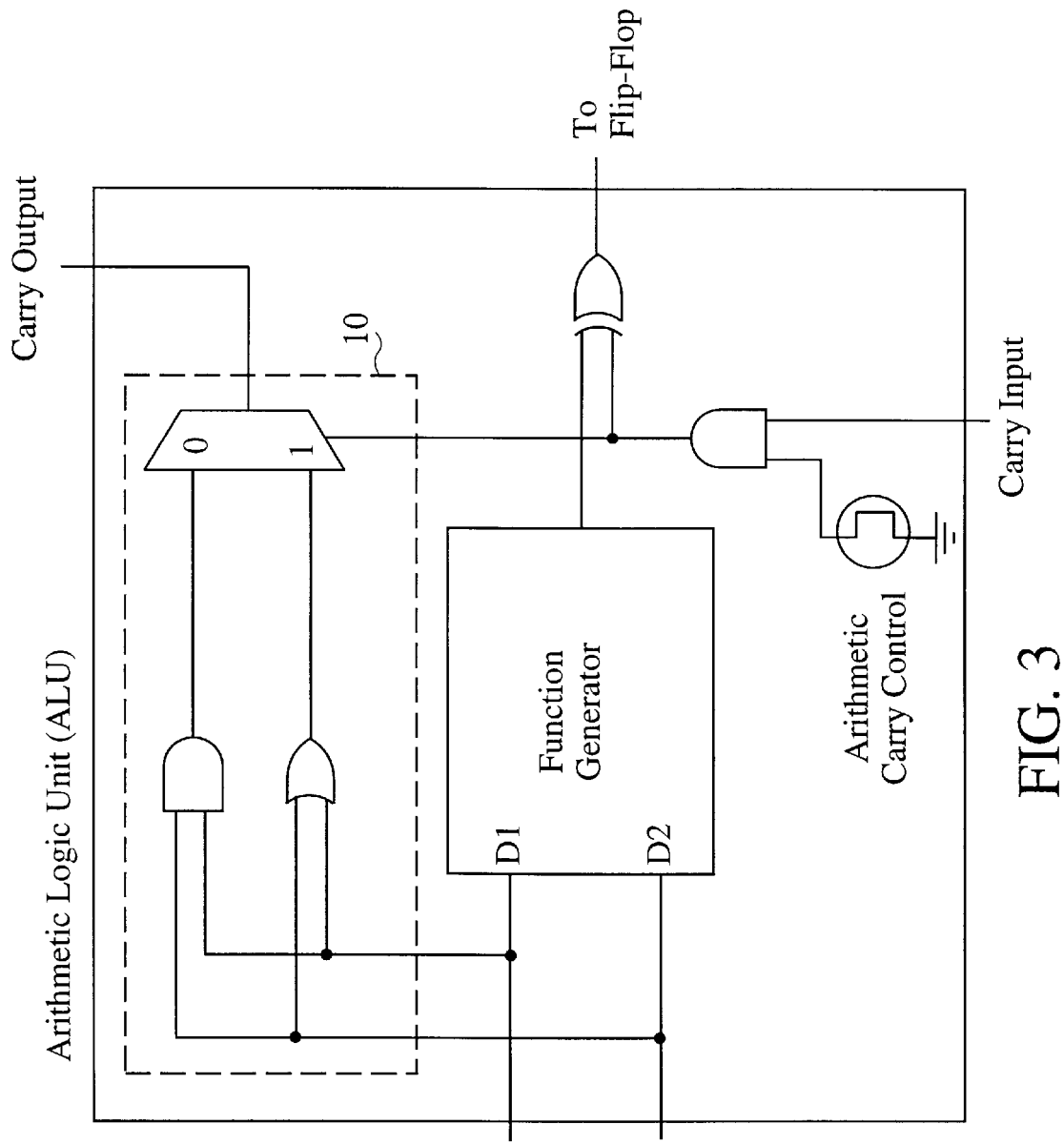
FIG. 3 is a schematic diagram of an ALU.
Figure 4:
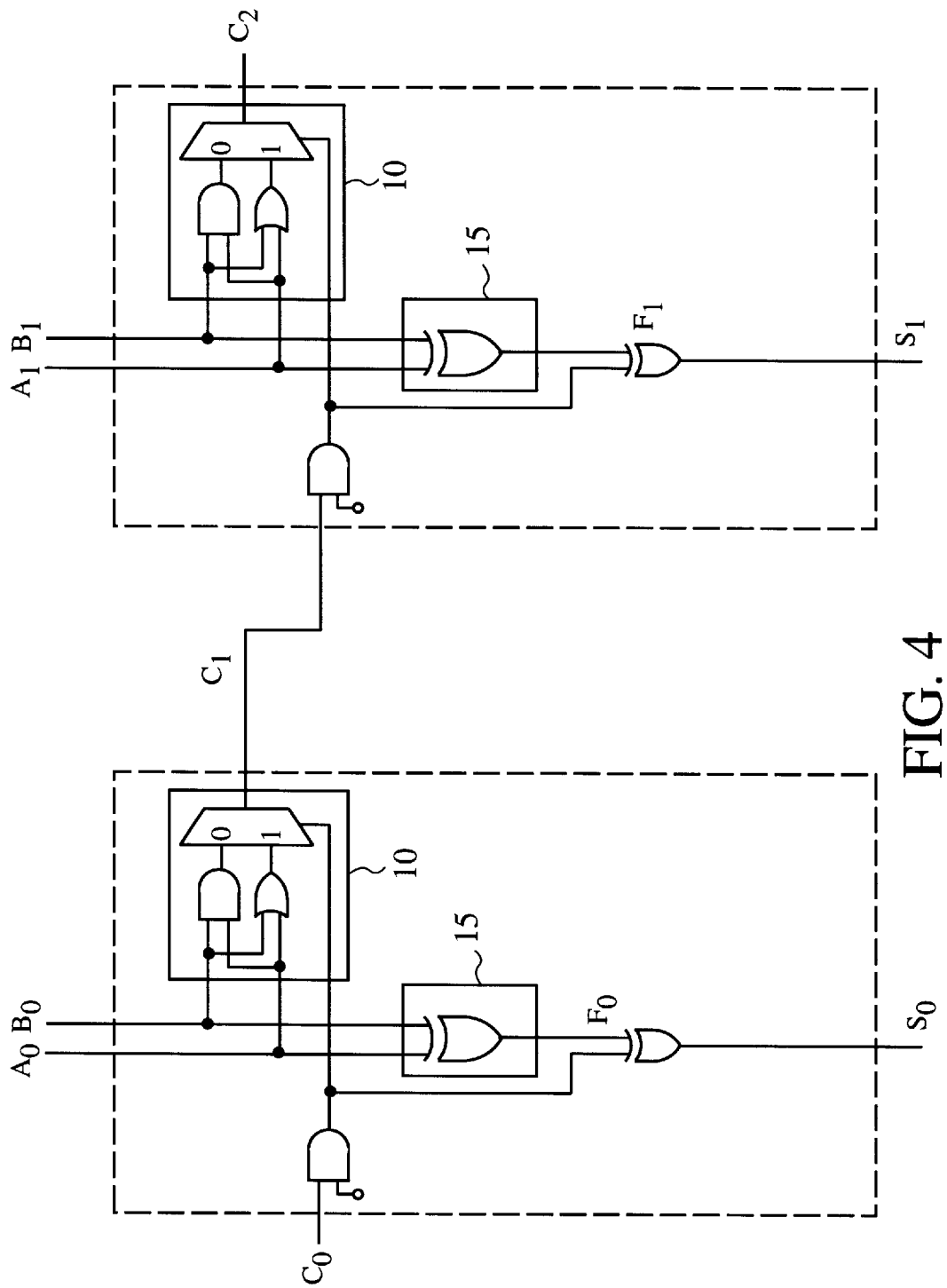
FIG. 4 is a simplified diagram of a prior art carry chain circuit programmed to implement an adder function.
Figure 5:
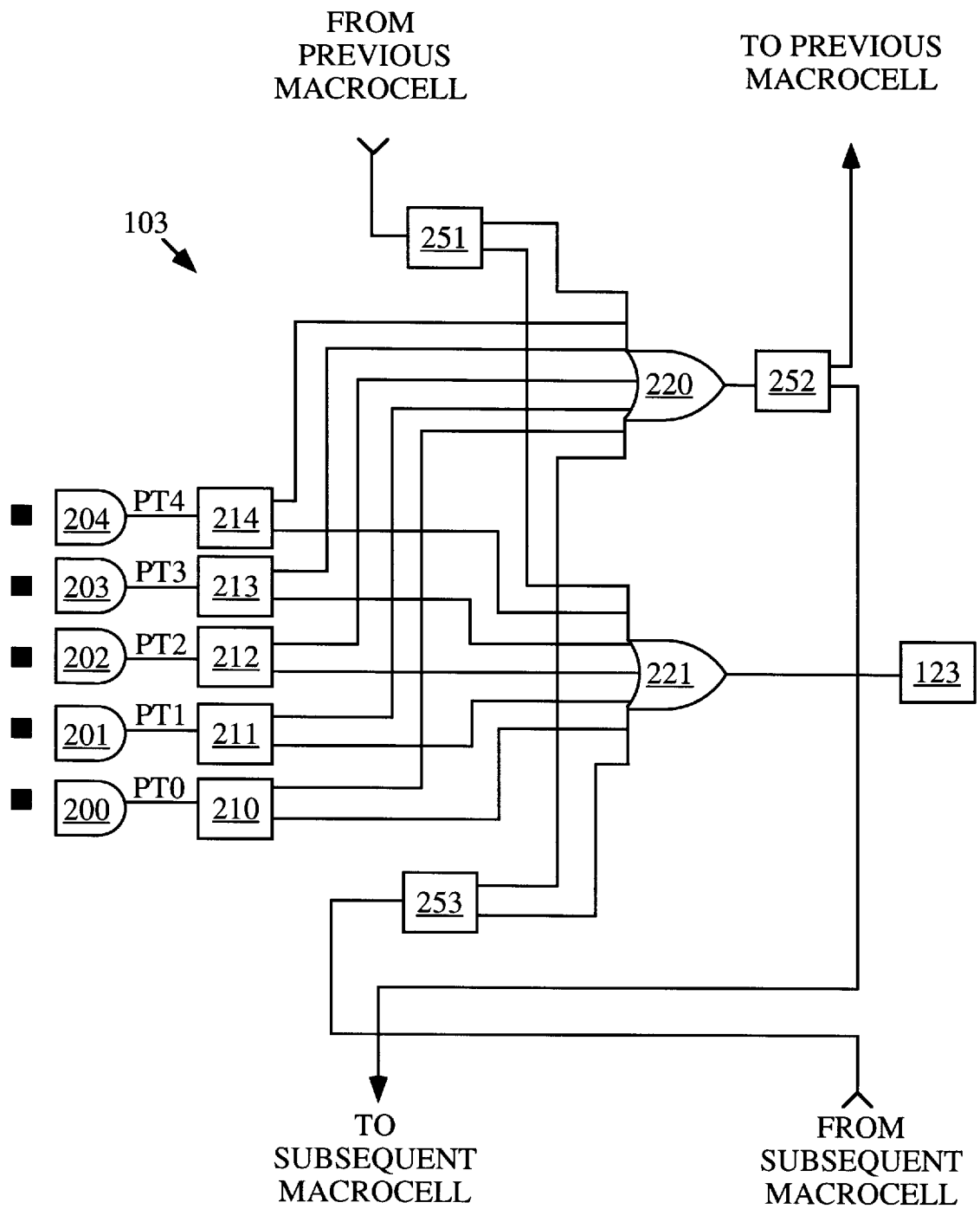
FIG. 5 is a schematic diagram of a macrocell without the inventive means for implementing an arithmetic function of the present invention.

FIG. 5 provides a schematic diagram illustrating macrocell 103 from the Xilinx XC9000 EPLD and first described in U.S. patent application Ser. No. 08/452,448. Macrocell 103 includes AND gates 200–204, product term distribution circuits 210–214, 7-input OR gates 220 and 221, and cascade control circuits 251–253. Product terms PT0, PT1, PT2, PT3 and PT4 are provided from logic forming circuitry (not shown) to sense amplifier circuits which are represented as single input AND gates 200, 201, 202, 203 and 204, respectively. As a result, product terms PT0–PT4 are routed to product term distribution circuits 210–214, respectively. Although the present invention is described in connection with product terms, it is understood that other logic signals derived from logic forming circuitry can be used in place of product terms.

The logic forming circuitry which provides the product terms is described in more detail and illustrated in U.S. Pat. No. 5,563,529. The logic forming circuitry may form an AND array or a look-up table.

Figure 6:
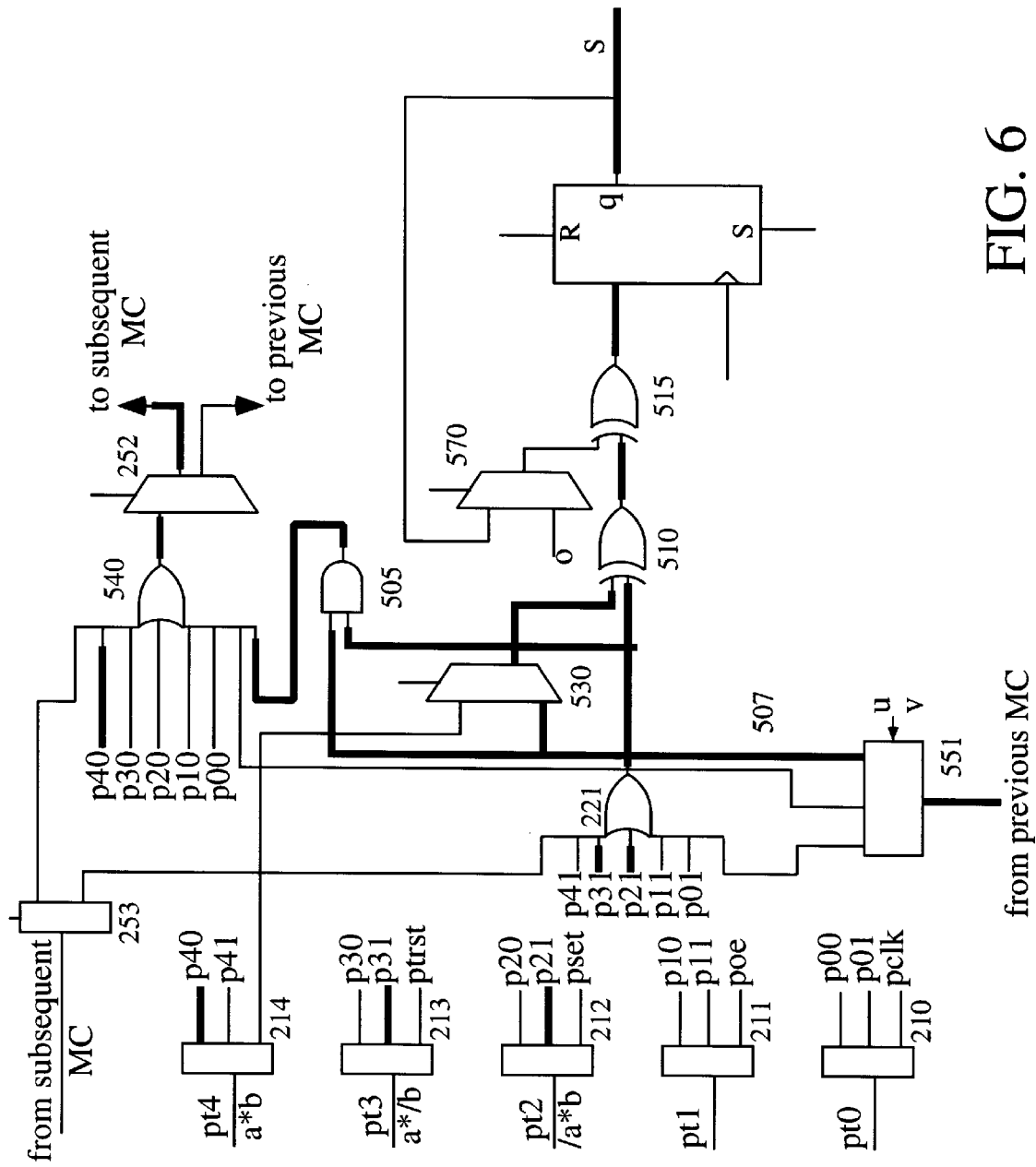
FIG. 6 is a schematic diagram of a first embodiment of the improved macrocell of the present invention implementing an addition function.

FIG. 6 illustrates a first embodiment of the improved macrocell of the present invention including arithmetic cascade circuitry not found in the macrocell in FIG. 5. The macrocell of FIG. 6 is configured for an adder implementation which receives input bits a and b, as well as carry signal Cin and produces output S where $$S = a \oplus b \oplus Cin, \tag{3}$$

and carry out signal Cout where $$Cout = a*b + a*Cin + b*Cin. \tag{4}$$

Product terms 212 through 214 provide signals /a*b, a*/b, and a*b, respectively. Control circuit 251 in FIG. 5 is replaced by three-way multiplexer 551 in FIG. 6 to forward a carry-in signal Cin from a previous macrocell to AND gate 505 across line 507. Control bits u and v control multiplexer 551 to ensure signal Cin is forwarded to AND gate 505 when desired. Cascade circuitry for forwarding carry signals between macrocells while bypassing the UIM includes AND gate 505 which provides signal Cin*(a*/b+/a*b) to an input of eight input OR gate 540 which replaces seven input OR gate 220 shown in FIG. 5. Thus, we find Cout defined in equation 5:

$$\begin{aligned}(5) \quad Cout &= a*b + (a*/b + /a*b)*Cin \\ &= a*b + a*/b * Cin + /a*b * Cin \\ &= a*b + a*/b*Cin + /a*b*Cin + a*Cin + b*Cin \\ &= a*b + a*Cin + b*Cin.\end{aligned}$$

Sum S of bits a and b is generated by forwarding through OR gate 221 signal a*/b from product term 213 and signal /a*b from product term 212, and the ORed signal through XOR gate 510 where the ORed product terms are XORed with signal Cin, and then forwarded through control circuit 530 from multiplexer 551. Since $$a*/b + /a*b = a \oplus b, \tag{6}$$

the output S of XOR gate 510 in FIG. 6 is $$S = a \oplus b \oplus Cin. \quad (7)$$

Figure 7:
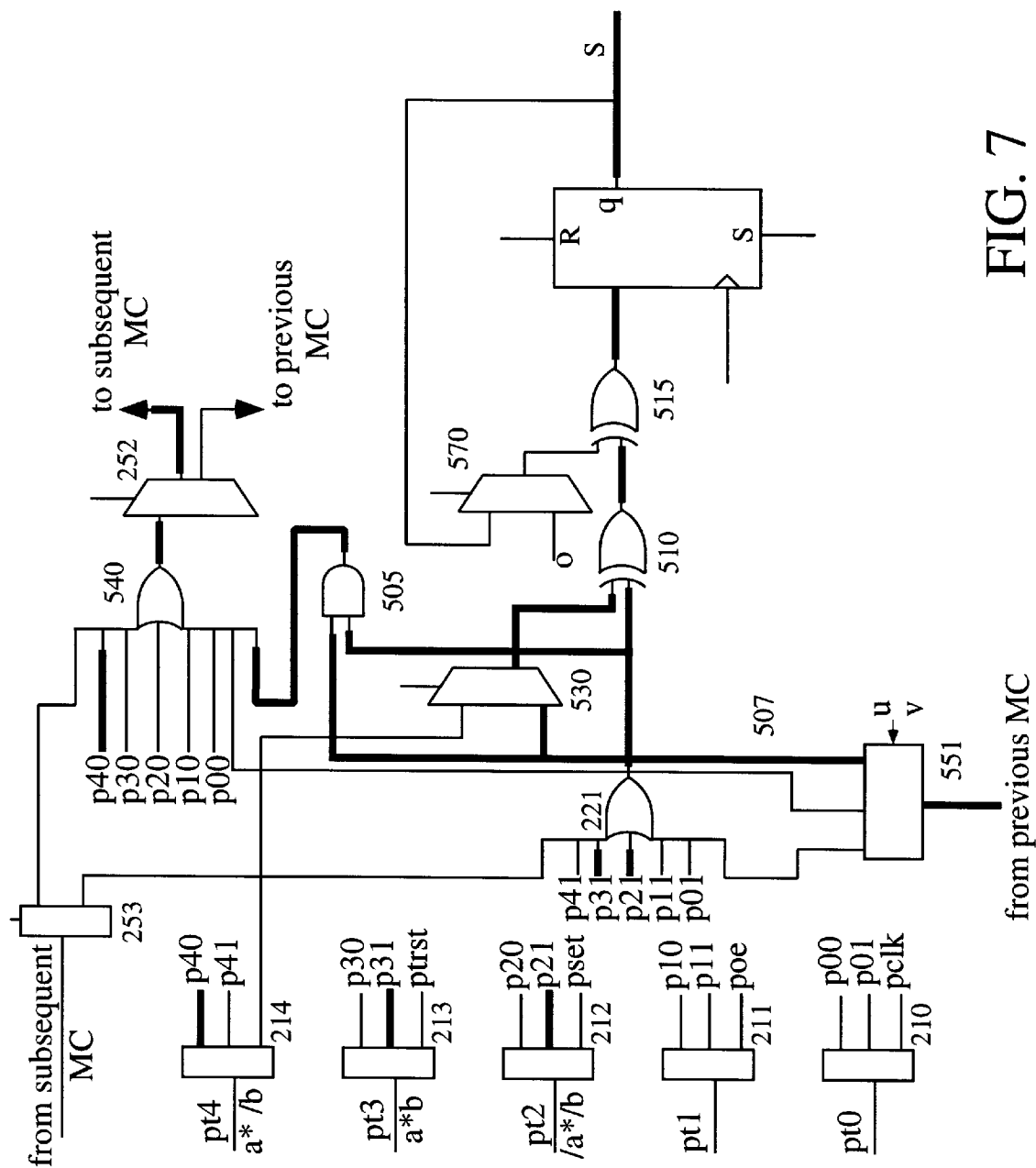
FIG. 7 is a schematic diagram of a first embodiment of the improved macrocell of the present invention implementing a subtraction function.

FIG. 7 illustrates the inventive macrocell of FIG. 6 slightly modified to receive the product terms necessary to subtract bit b from bit a wherein difference $$S = (a*b + /a*/b) \oplus Cin = a \oplus /b \oplus Cin \quad (8)$$

and carry bit

| (9) | Cout | = a*/b + [(a*b + /a */b) * Cin] |
|---|---|---|
| | | = a*/b + a*b *Cin + /a*/b*Cin |
| | | = a*/b + a*b*Cin + /a*/b*Cin + a*Cin + /b*Cin |
| | | = a*/b + a*Cin + /b*Cin. |

Other than the modification to the product terms, the inventive macrocells of FIGS. 6 and 7 are equivalent.

FIGS. 6 and 7 therefore reveal a number of the advantages of the improved macrocell of the present invention. First, device resources are conserved. Where the circuit of FIG. 5 would require two macrocells for each bit of an adder configuration (one to produce a sum and another to produce a carry out), the improved macrocell of the present invention requires only one macrocell to create both sum and carry. Of course, for a 16-bit adder, use of 16 macrocells will be avoided, as will use of the UIM for the 15 additional interconnects between these macrocells.

Second, the delay encountered in performing arithmetic functions is significantly reduced since half of the macrocell and all of the UIM delay sources are avoided. For example, for Xilinx device 95108-7PQ160, which includes macrocells not having the advantageous arithmetic cascading structure of the present invention, macrocell delay for performing an arithmetic function is approximately 2.5 ns and UIM delay is approximately 6 ns. Input delay through the P terms is approximately 2.5 ns and output delay is approximately 4.5 ns. Thus, if one were to use the macrocell of FIG. 5 to implement a 16-bit adder, total delay D would be found in equation 10:

| (10) | D | = Tinput + 16(Tmacrocell) + 15(Tuim) + Toutput |
|---|---|---|
| | | = 2.5ns + 16(2.5ns) + 15(6ns) + 4.5ns |
| | | = 137ns. |

Using the circuit of FIGS. 6 and 7, delay D can be significantly reduced. Cascade circuitry delay through, for example, selector 252, is 1.5 ns, but provides an excellent substitute for the slower UIM delay of 6 ns. Total delay for a 16 bit arithmetic function using the improved macrocell of the present invention is therefore:

| | D | = Tinput + Thacrocell + 15(Tcascade) + Toutput |
|---|---|---|
| | | = 2.5ns + (2.5ns) + 15(1.5ns) + 4.5ns |
| | | = 32ns. |

Delay is thereby reduced 76 percent. This percentage will increase, of course, with larger arithmetic functions. Significantly, adding the cascade circuitry of the present invention shown in FIGS. 6 and 7 to the prior art macrocell of FIG. 5 does not affect non-arithmetic function timing of the macrocell.

Figure 8:
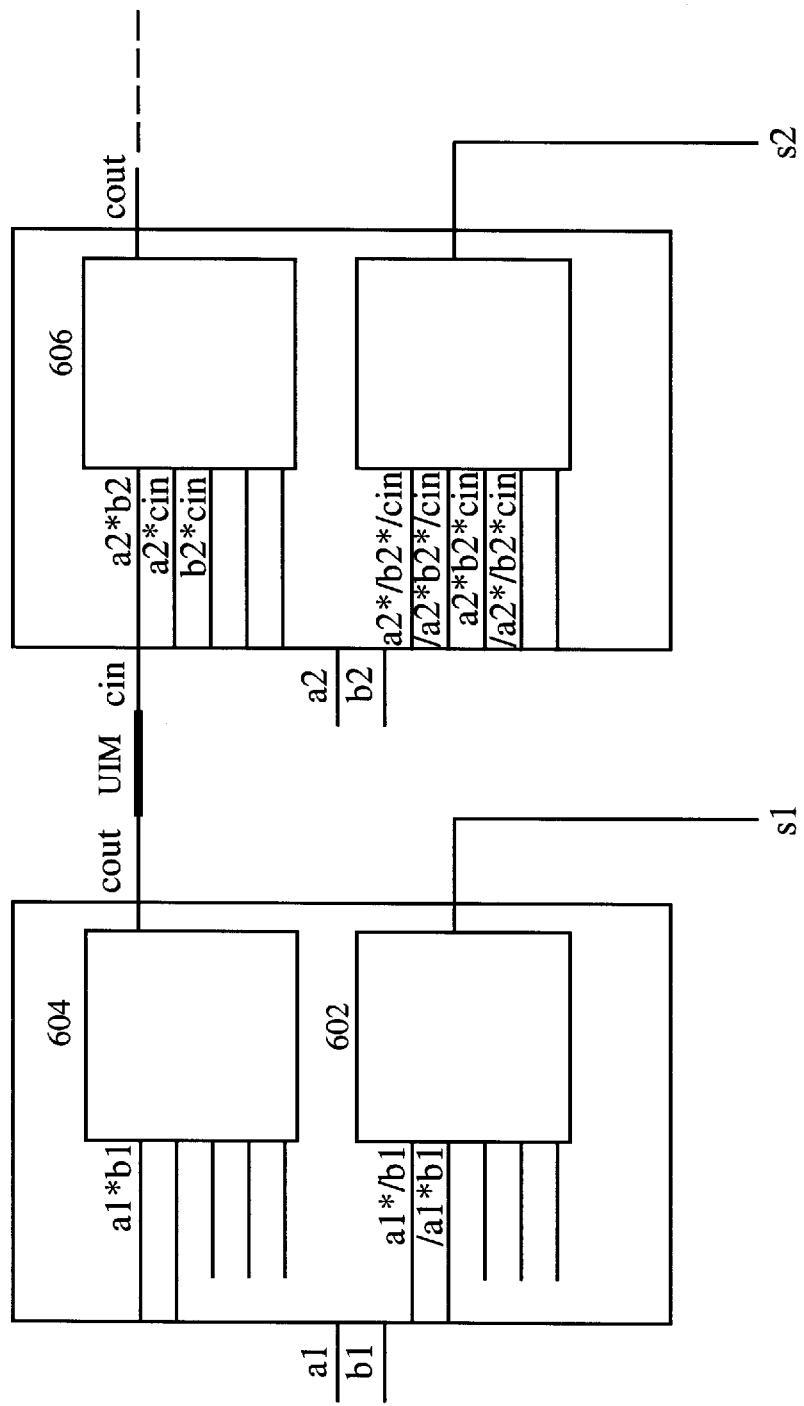
FIG. 8 is a block diagram of a prior art full adder implementation.
Figure 9:
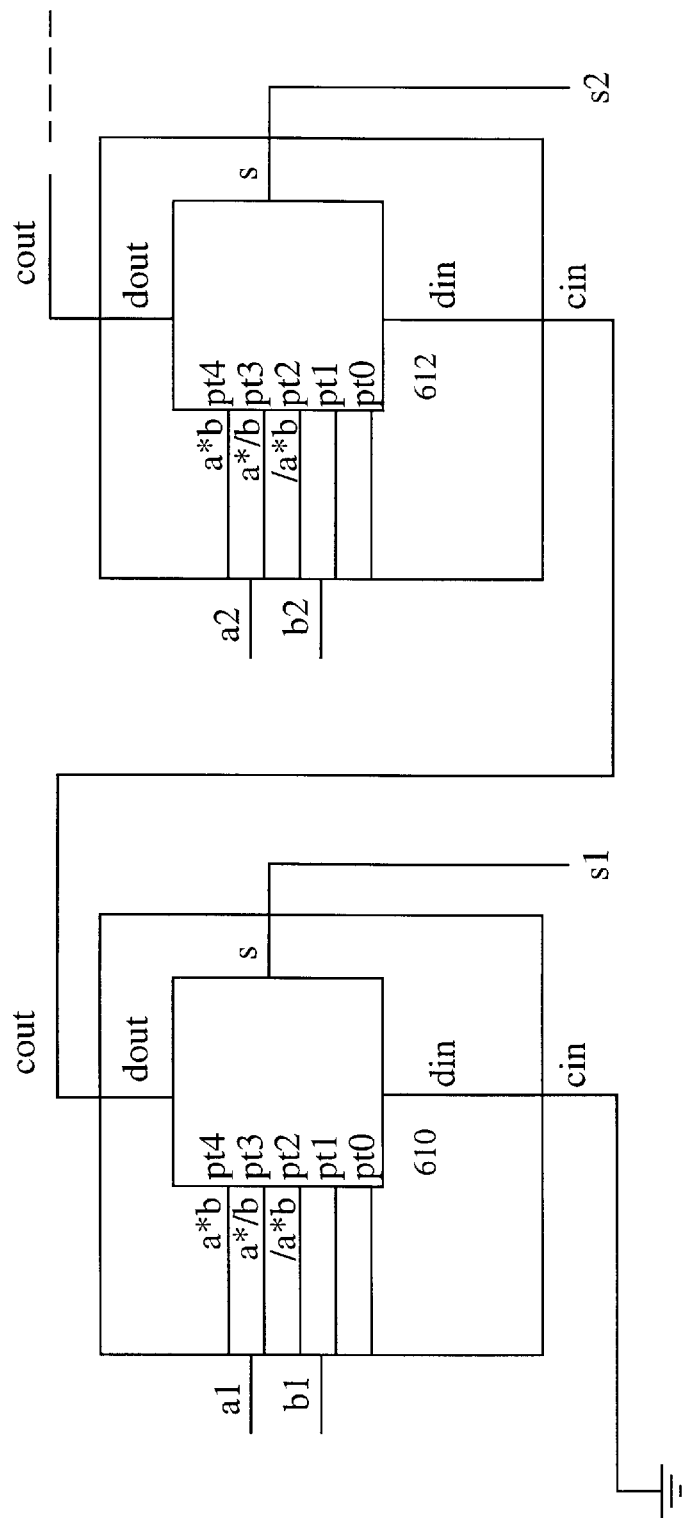
FIG. 9 is a block diagram of a full adder implemented using the improved macrocell of the present invention.

FIGS. 8 and 9 illustrate by comparison the reduced need for macrocell resources when the arithmetic and cascade circuitry of the present invention are incorporated into the macrocell design. FIG. 8 illustrates an adder circuit for adding four bits a1, b1, a2, and b2 utilizing a plurality of the macrocells shown in FIG. 5. The adder of FIG. 8 requires a first macrocell 602 to generate the sum of two bits a1 and b1 and a second macrocell 604 to generate a carry out signal. Moreover, a UIM must be used to interconnect the two carry-bit macrocells 604 and 606. Four macrocells are therefore required for four bit addition. In contrast, the arithmetic circuit of FIG. 9 requires only two macrocells and no UIM to accomplish the same function as the circuit of FIG. 8. Macrocell 610 generates both the sum S1 of a1 and b1 as well as carry bit Cout. Cout is forwarded through the cascade circuitry of the present invention to macrocell 612 which generates both the sum S2 of a2 and b2 as well as an additional carry bit.

Figure 10:
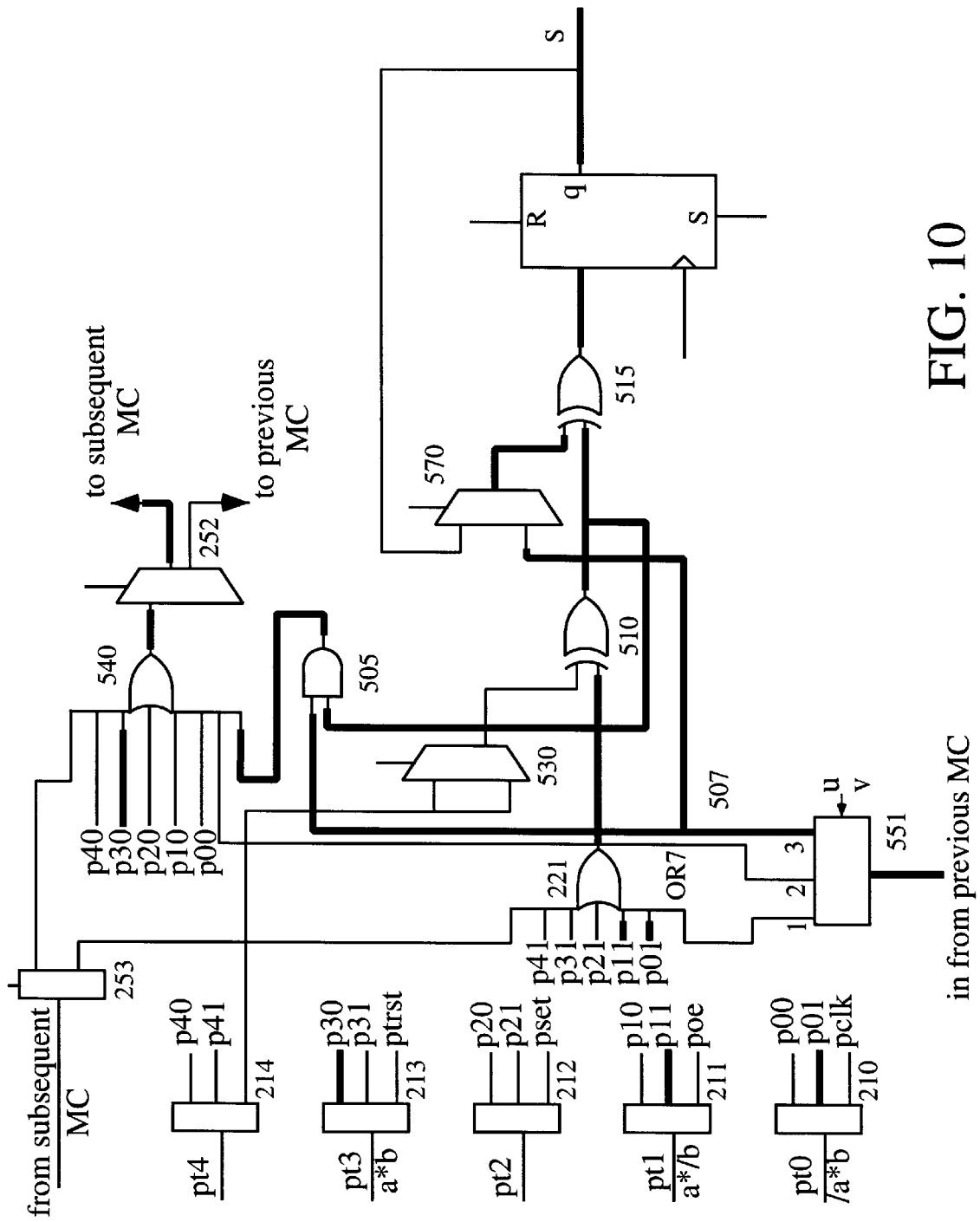
FIG. 10 is a schematic diagram of a second embodiment of the improved macrocell of the present invention implementing an addition function.
Figure 11:
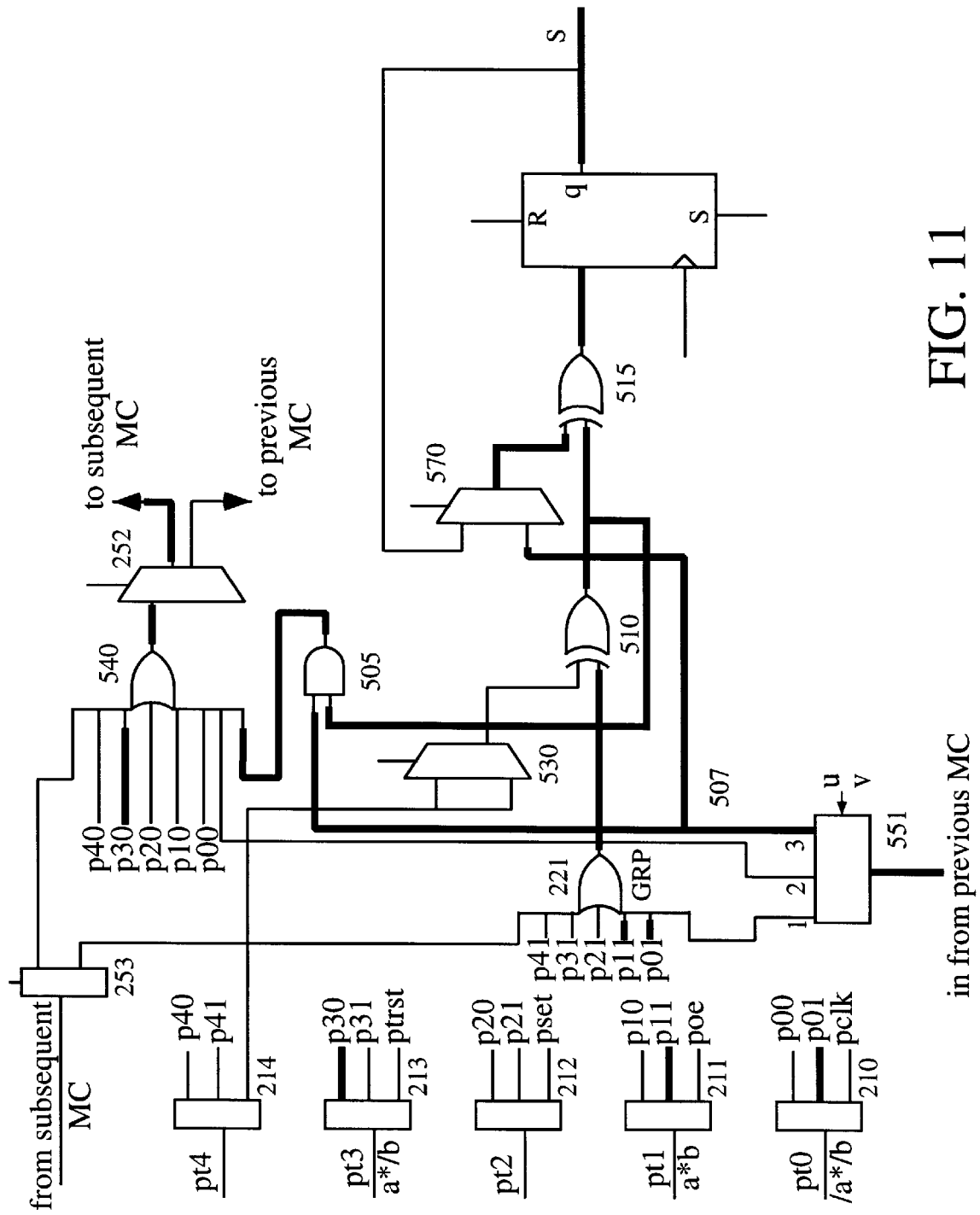
FIG. 11 is a schematic diagram of a second embodiment of the improved macrocell of the present invention implementing a subtraction function.

FIGS. 10 and 11 illustrate additional embodiments of the cascading and full adder and subtractor implementing circuits of the present invention. P-terms 210–214 in FIG. 10 provide inputs a*b, a*/b and /a*b. Multiplexer 551 forwards Cin to AND gate 505 where it is logically ANDed with the logical value a*/b+/a*b provided by XOR gate 510. The output of AND gate 505 is ORed with the logical value a*b using OR gate 540, and is forwarded to the next macrocell via switch 252.

The Cout output from the macrocell therefore has the logic value:

| (11) | Cout | = a*b + a*/b*Cin +/a*b*Cin |
|---|---|---|
| | | = a*b + a*/b*Cin + /a*b*Cin + a*Cin + b*Cin |
| | | = a*b + a*Cin +b*Cin |

Furthermore, the S output of the macrocell has the value:

$$S = a \oplus b \oplus Cin \quad (12)$$

as shown in the circuit of FIG. 6. The subtractor implementation of FIG. 11 requires only a change in the P-term inputs whereby $$Cout = a*/b + a*Cin + /b*Cin. \quad (13)$$

Difference S is $$S = (a*b + /a*/b) \oplus Cin, \quad (14)$$

as found in the circuit of FIG. 7.

Figure 12:
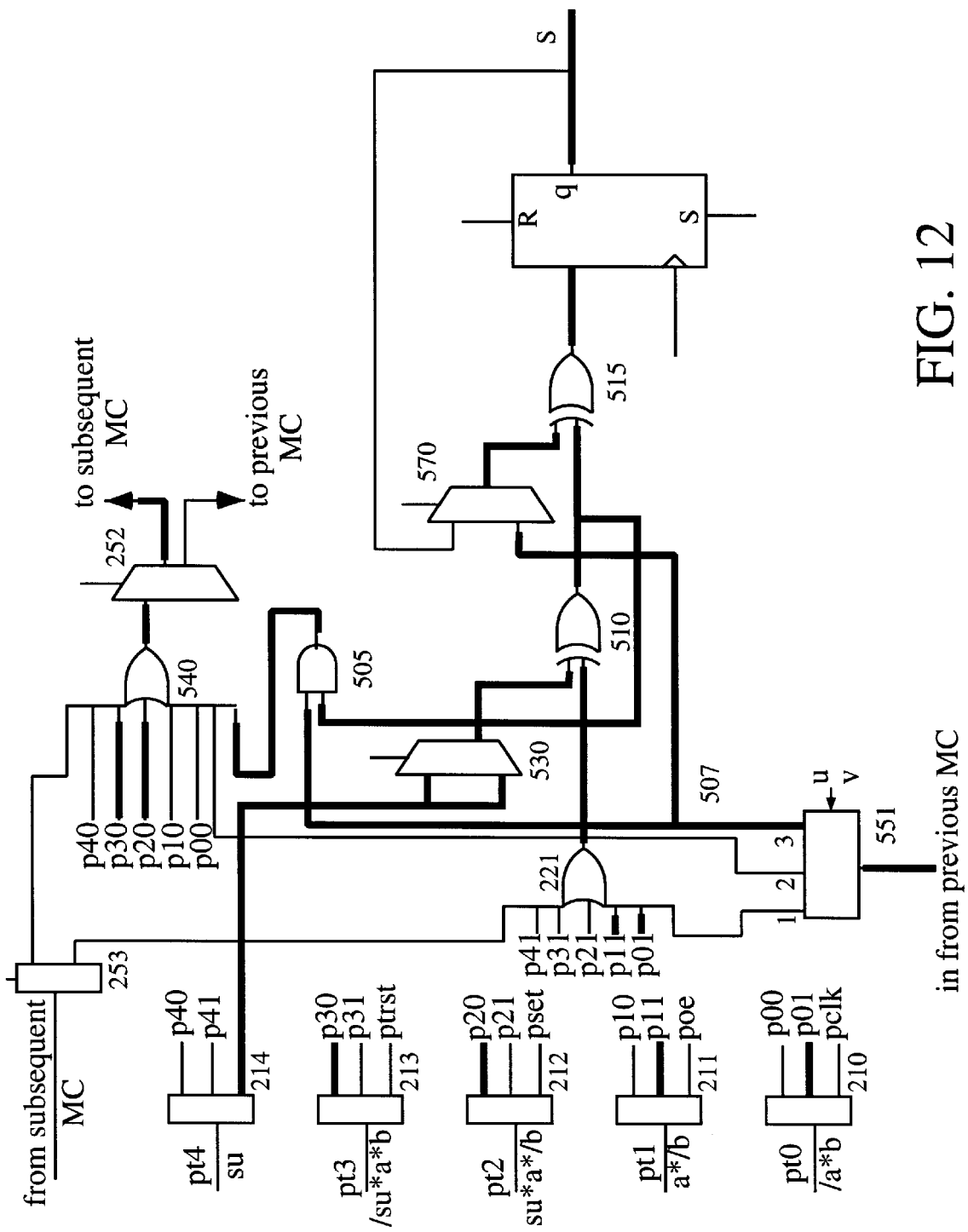
FIG. 12 is a schematic diagram of a second embodiment of the improved macrocell of the present invention implementing a selectable arithmetic function.

By adding an additional input signal and slightly modifying the P-terms of the circuit of FIGS. 10 and 11, we obtain a selectable adder circuit as shown in FIG. 12. Unlike the circuits of FIGS. 6 and 7, the circuit illustrated in FIG. 12 can be switched between addition and subtraction implementations by manipulating signal SU. Signal SU is provided by input 214 to XOR 510 via switch 530. Subtraction of bit b from bit a occurs when input signal SU=1. Addition of the two input bits occurs when SU=0. To create output S, XORing of the input terms with Cin occurs at XOR gate 515 via switch 570. Cout is provided by OR gate 540 to output switch 252 so that

| (15) | Cout | = ((/SU * a * b + SU * a * /b) + (a ⊕ b ⊕ SU)Cin) |
|---|---|---|
| | | = a(/SU *b + SU * /b) + a * /((b ⊕ SU)Cin) + |

-continued $$/a * (b \oplus SU)Cin$$
$$= a(b \oplus SU) + a * /((b \oplus SU)Cin) + /a(b \oplus SU)Cin + a*Cin + (b \oplus SU)Cin$$
$$= a(b \oplus SU) + a * Cin + (b \oplus SU)Cin.$$

Delay caused by the combined adder/subtractor shown in FIG. 12 as compared to the macrocell of FIG. 5 is considerably reduced. Two of the macrocells of FIG. 5 would be required to produce each bit of the combined arithmetic function. A first prior art macrocell would create sum $$S1 = a \oplus b \oplus SU \oplus Cin = (/a*/b*SU + /a*b*/SU + a*/b*/SU + a*b*SU) \oplus Cin. \quad (16)$$

A second prior art macrocell would supply

(17)    Cout $= a*b*/SU + a*/b*SU + Cin*b*/SU + Cin*/b*SU + a*Cin$
$= a(b \oplus SU) + a*Cin + Cin(b \oplus SU)$ The inventive macrocell architecture therefore requires only one macrocell for each two required by the macrocell of FIG. 5. For a 16-bit adder implemented using the circuit of FIG. 12, timing delays are avoided for 16 macrocells and 15 UIM interconnections, resulting in an over 50 percent reduction in delay.

The macrocell of FIGS. 10, 11 and 12 can also implement an XOR function far more efficiently than the macrocell of FIG. 5. If, for example, eight bits were to be XORed together using the macrocell architecture of FIG. 5, then three macrocells would be required to find

(18)    y $= x1 \oplus x2 \oplus x3 \oplus x4 \oplus x5 \oplus x6 \oplus x7 \oplus x8$
$= (x1 \oplus x2 \oplus x3 \oplus x4) \oplus (x5 \oplus x6 \oplus x7 \oplus x8).$ This equation would be implemented in its three constituent parts, wherein two macrocells create first and second intermediate outputs A and B where

(19)    A $= (x1 \oplus x2 \oplus x3 \oplus x4)$
$= (x1*x2*x3 + /x1*/x2*x3 + /x1*x2*/x3 + x1*/x2*/x3) \oplus x4$ and
(20)    B $= (x5 \oplus x6 \oplus x7 \oplus x8)$
$= (x5*x6*x7 + /x5*/x6*x7 + /x5*x6*/x7 + x5*/x6*/x7) \oplus x8,$ and a third macrocell receives signals A, B and x8 to create output $$y = A \oplus B. \quad (21)$$

Figure 13:
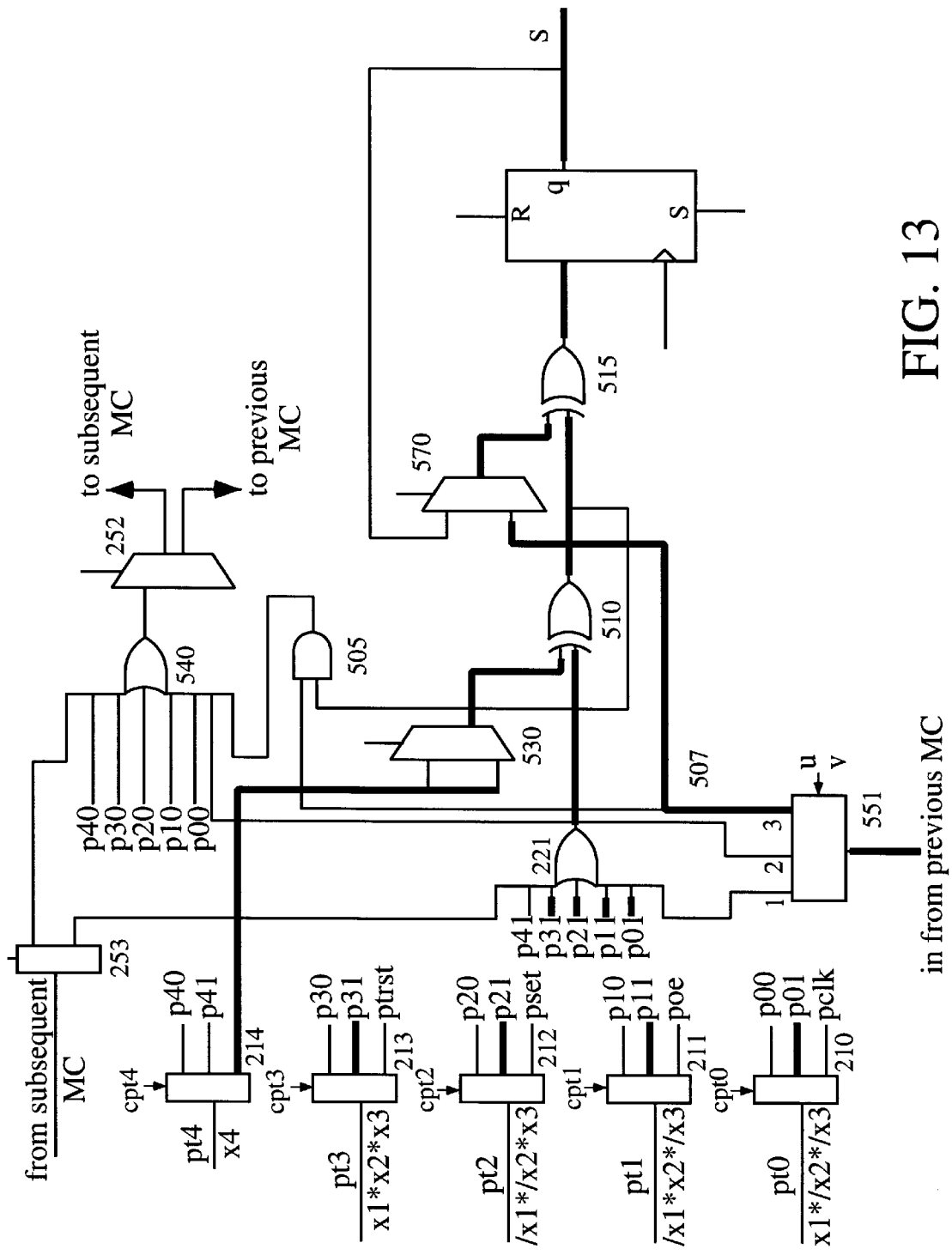
FIG. 13 is a schematic diagram of a second embodiment of the improved macrocell of the present invention implementing an XOR function for eight bits.

The new architecture of the present invention requires only two macrocells to implement the same function and uses the cascade circuitry of the present invention to avoid delay from the UIM. As shown in FIG. 13, a first macrocell implements the equation $$A = (x1*x2*x3 + /x1*/x2*x3 + /x1*x2*/x3 + x1*/x2*/x3) \oplus x4. \quad (22)$$

A second macrocell receives signal A via the cascade circuitry and XORs this signal with the remaining terms providing output $$y = A \oplus ((x5*x6*x7 + /x5*/x6*x7 + /x5*x6*/x7 + x5*/x6*/x7) \oplus x8). \quad (23)$$

Thus, considerable device resources are preserved for other functions and delay associated without implementation of the XOR function is reduced.

The present invention therefore provides an advantageous macrocell architecture which accommodates desirable cascaded arithmetic functions while retaining routing advantages not found in previous devices. While the present invention has been described with reference to certain preferred embodiments, those skilled in the art to which the present invention pertains will now, as a result of the applicant's teachings herein, recognize that various modifications and other embodiments may be provided. By way of example, the precise structure of the arithmetic and cascade logic may be modified while preserving the advantages of the increased configurability and resources of the invention. These and other variations upon and modifications to the embodiment described herein are deemed to be within the scope of the invention which is to be limited only by the following claims.

What is claimed is:

1. A first macrocell which connects between logic forming circuitry of a programmable logic device and an output terminal of the programmable logic device, the first macrocell comprising:

one or more input lines which are connected to receive a corresponding number of logic signals from the logic forming circuitry;

one or more distribution circuits, each distribution circuit coupled to one of the input lines, wherein each distribution circuit is independently programmable to a first state or a second state, wherein a distribution circuit programmed in the first state routes a received logic signal to the output terminal of the programmable logic device, and wherein a distribution circuit programmed in the second state routes received logic signals to a second macrocell of the programmable logic device; and means for implementing an arithmetic logic function, in electrical communication with at least one of said one or more distribution circuits, said means for implementing including means for generating a carry signal.

2. The macrocell of claim 1, wherein the logic forming circuitry comprises a memory array.

3. The macrocell of claim 2, wherein the memory array comprises an array of AND gates.

4. The macrocell of claim 2, wherein the memory array comprises a look up table.

5. The macrocell of claim 1, wherein the input lines are product term lines and the logic signals are product terms.

6. The macrocell of claim 1, wherein said means for implementing an arithmetic function comprises receiving means for receiving a carry signal from another macrocell.

7. The macrocell of claim 1, wherein said means for generating a carry signal comprises means for logically combining a received carry signal with a plurality of input bits received across a plurality of said one or more input lines.

8. The macrocell of claim 1, further comprising a cascade control circuit coupled to a third macrocell, the cascade control circuit being programmable to a first state in which the output signals from the third macrocell are routed to the output terminal of the programmable logic device or a second state in which the output signals from the third macrocell are routed to the second macrocell.

9. The macrocell of claim 8, further comprising a logic gate having input terminals coupled to the one or more distribution circuits and an output terminal coupled to the cascade control circuit.

10. The macrocell of claim 9, wherein the logic gate is an OR gate.

11. The macrocell of claim 8, wherein the cascade control circuit comprises:
  a programmable latch having an output terminal;
  a first multiplexer having a control terminal coupled to the output terminal of the programmable latch, a first input terminal coupled to the distribution circuits, a second input terminal coupled to a reference voltage, and an output terminal coupled to the second macrocell; and
  a second multiplexer having a control terminal coupled to the output terminal of the programmable latch, a first input terminal coupled to the reference voltage, a second input terminal coupled to the distribution circuits, and an output terminal coupled to the third macrocell.

12. The macrocell of claim 1, further comprising a cascade control circuit having an input terminal connected to a third macrocell, whereby the cascade control circuit can receive logic signals from the third macrocell, the cascade control circuit being programmable to a first state, wherein in the first state the cascade control circuit routes the received logic signals to the output terminal of the programmable logic device.

13. The macrocell of claim 12, wherein the cascade control circuit is further programmable to a second state, wherein in the second state the cascade control circuit routes the received logic signals through the macrocell to the other macrocell.

14. A first macrocell which connects between logic forming circuitry of a programmable logic device and an output terminal of the programmable logic device, the first macrocell comprising:
  an export logic gate;
  a first cascade control circuit connected to receive logic signals from a second macrocell, wherein the first cascade control circuit is programmable to route logic signals received from the second macrocell to the export logic gate;
  a second cascade control circuit connected to an output terminal of the export logic gate, wherein the second cascade control circuit is programmable to route logic signals received by the export logic gate to a third macrocell; and
  means for implementing an arithmetic logic function, in electrical communication with at least one of said cascade control circuits, said means for implementing including means for generating a carry signal.

15. The macrocell of claim 14, wherein the logic signals are product terms.

16. The macrocell of claim 14, wherein said means for implementing an arithmetic function comprises receiving means for receiving a carry signal from another macrocell.

17. The macrocell of claim 14, wherein said means for generating a carry signal comprises means for logically combining a received carry signal with a plurality of input bits received across a plurality of input lines within said first macrocell.

18. The macrocell of claim 17, wherein the first cascade control circuit is further programmable to route the logic signals received from the second macrocell to the output terminal of the programmable logic device.

19. The macrocell of claim 18, further comprising a local logic gate coupled between the first cascade control circuit and the output terminal of the programmable logic device.

20. The macrocell of claim 19, wherein the export logic gate and the local logic gate each comprise an OR gate.

21. The macrocell of claim 14, further comprising:
  a third cascade control circuit connected to receive logic signals from the third macrocell, wherein the third cascade control circuit is programmable to route logic signals received from the third macrocell to either the export logic gate or the output terminal of the programmable logic device.

22. The macrocell of claim 21, further comprising a local logic gate coupled between the first and third cascade control circuits and the output terminal of the programmable logic device.

23. The macrocell of claim 22, wherein the local logic gate and the export logic gate each comprise an OR gate.

24. A first macrocell which connects between logic forming circuitry of a programmable logic device and an output terminal of the programmable logic device, the first macrocell comprising:
  one or more input lines which receive a corresponding number of logic signals;
  a local logic gate;
  an export logic gate;
  one or more distribution circuits, each connected to a corresponding one of the input lines, wherein each distribution circuit is independently programmable to route a corresponding logic signal to either the local logic gate or the export logic gate;
  a first cascade control circuit connected to an output terminal of the export logic gate, wherein the first cascade control circuit is programmable to route logic signals received by the export logic gate to either a second macrocell or a third macrocell;
  a second cascade control circuit connected to receive logic signals from the second macrocell, wherein the second cascade control circuit is programmable to route logic signals received from the second macrocell to either the export logic gate or the local logic gate;
  a third cascade control circuit connected to receive logic signals from the third macrocell, wherein the third cascade control circuit is programmable to route logic signals received from the third macrocell to either the export logic gate or the local logic gate; and
  means for implementing an arithmetic logic function, in electrical communication with at least one of said cascade control circuits, said means for implementing including means for generating a carry signal.

25. The macrocell of claim 24, wherein the input lines are product term lines and the logic signals are product terms.

26. The macrocell of claim 24, wherein said means for implementing an arithmetic function comprises receiving means for receiving a carry signal from another macrocell.

27. The macrocell of claim 24, wherein said means for generating a carry signal comprises means for logically combining a received carry signal with a plurality of input bits received across a plurality of said one or more input lines.

28. A method of implementing arithmetic functions in a programmable logic device having a plurality of macrocells and an interconnect matrix connecting said macrocells, the method comprising the steps of:
  providing a first plurality of logic signals to a first macrocell of the programmable logic device;
  calculating a first carry out signal and a first arithmetic result signal within said first macrocell;

forwarding said first carry out signal to a second macrocell of said programmable logic device substantially without utilizing said interconnect matrix;

calculating a second carry out signal and a second arithmetic result signal within said second macrocell.

29. The method of claim 28, wherein the second macrocell is located adjacent to the first macrocell.

30. The method of claim 28, wherein the step of forwarding the first carry signal to a second macrocell further comprises the step of transmitting the signals through one or more intermediate macrocells of the programmable logic device.

31. The method of claim 28, wherein the step of forwarding the first carry signal comprises the step of selecting a direction of transmission.

32. A first macrocell which connects between logic forming circuitry of a programmable logic device and an output terminal of the programmable logic device, the first macrocell comprising:

one or more input lines which are connected to receive a corresponding number of logic signals from the logic forming circuitry;

one or more distribution circuits, each distribution circuit coupled to one of the input lines, wherein each distribution circuit is independently programmable to a first state or a second state, wherein a distribution circuit programmed in the first state routes a received logic signal to the output terminal of the programmable logic device, and wherein a distribution circuit programmed in the second state routes received logic signals to a second macrocell of the programmable logic device; and means for forwarding a plurality of signals generated by the first macrocell and a plurality of input signals received from the second macrocell to an exclusive-OR (XOR) gate to produce an XOR function.

* * * * *